United States Patent [19]

Popovic et al.

[11] Patent Number: 4,963,827
[45] Date of Patent: Oct. 16, 1990

[54] INTERMITTENTLY ACTIVATED MAGNETIC SHIELD ARRANGEMENT FOR REDUCING NOISE AND OFFSETS IN SOLID STATE MAGNETIC FIELD SENSORS

[75] Inventors: Radivoje Popovic, Fridbach; Thomas Seitz, Hasenbühlweg, both of Switzerland

[73] Assignee: LGZ Landis & Gyr Zug AG, Zug, Switzerland

[21] Appl. No.: 398,228

[22] Filed: Aug. 24, 1989

[30] Foreign Application Priority Data

Sep. 13, 1988 [CH] Switzerland .................. 03413/88

[51] Int. Cl.$^5$ .............. G01R 33/06; G01R 33/04
[52] U.S. Cl. .................. 324/251; 33/355 R; 324/117 H; 324/252; 324/253; 357/27
[58] Field of Search ........... 324/225, 244, 247–260, 324/117 H, 207.2, 207.21; 357/27; 33/355 R, 361, 363 R; 338/32 R, 32 H; 307/309

[56] References Cited

U.S. PATENT DOCUMENTS

| | | |
|---|---|---|
| 2,786,179 | 3/1957 | Arnold et al. |
| 4,205,266 | 5/1980 | Lichtenberg ............. 324/253 |
| 4,402,142 | 9/1983 | Dinsmore ............. 33/363 R |
| 4,463,314 | 7/1984 | Wilson ............. 324/253 X |
| 4,649,755 | 3/1987 | Volz ............. 324/208 |
| 4,694,583 | 9/1987 | Blaney ............. 33/361 |
| 4,749,939 | 6/1988 | Seitz ............. 324/117 H |

FOREIGN PATENT DOCUMENTS

| | | |
|---|---|---|
| 0157470 | 10/1985 | European Pat. Off. |
| 1105514 | 5/1958 | Fed. Rep. of Germany ...... 324/251 |
| 2921546 | 12/1980 | Fed. Rep. of Germany |
| 659138 | 12/1986 | Switzerland ............. 324/260 |

OTHER PUBLICATIONS

Otto Limann, Elecktronik ohne Ballast, 4th Edition, 1975, Franzis Verlag Munchen, p. 139.
ATM Archiv fur Technisches Messen, V392-1, Aug. 1952, pp. 175–178.

Primary Examiner—Gerard R. Strecker
Attorney, Agent, or Firm—Marmorek, Guttman & Rubenstein

[57] ABSTRACT

The instant invention is a magnetic field sensor intermittently shielded by a controllable, saturable, magnetic shield. The magnetic shield is periodically driven into saturation by means of an excitation coil. The magnetic field to be measured is not disturbed by the shield during those time intervals when the shield is saturated. Intermittent sensing of the magnetic field to be measured, by the intermittently shielded magnetic field sensor, yields a magnetic field measurement unaffected by 1/f noise and offset errors.

14 Claims, 2 Drawing Sheets 4,963,827

INTERMITTENTLY ACTIVATED MAGNETIC SHIELD ARRANGEMENT FOR REDUCING NOISE AND OFFSETS IN SOLID STATE MAGNETIC FIELD SENSORS

FIELD OF THE INVENTION

The instant invention relates to a form of magnetic field sensor for measuring magnetic fields.

BACKGROUND OF THE INVENTION

A magnetic field sensor for measuring a magnetic field is known from the German OS 2,921,546. This device utilizes a Hall element as the magnetic field sensor. In order to increase the sensitivity of the Hall element, said Hall element is fed not continuously but in impulses. The amplitude of the current fed by impulses can be selected to be greater than the amplitude of the highest admissible continuous current. It is limited by the criterion that the pulsating current integrated over time may not exceed the integral over time of the continuous current. The pulsating output voltage of the Hall element is amplified, rectified and fed to a measuring instrument.

A further device to measure a magnetic field is known (EP-OS 0,157,470) and is based on the generally known principle of the Förster probe. As with the Förster probe, an iron core is driven periodically into saturation. Instead of a measuring winding, however, a Hall element is used and is installed in a magnetic discontinuity of the iron core. If this device is subjected to a magnetic field, even-numbered harmonics are produced in the output signal just as with the Förster probe, and these are evaluated. The measured value is chopped up by the periodic saturation of the iron core. This results in a noise cancellation and an elimination of the offset of the Hall element. The excitation current must however be of sufficient magnitude since at least one magnetic discontinuity must be present to receive the Hall element.

When measuring lower, non-electric magnitudes over greater periods of time, the so-called 1/f noise and the offset of the sensor and amplification elements become very noticeable. A method which is known in measuring technology to eliminate the noise and the offset of DC amplifiers is the chopping method. The low direct voltage to be amplified is first converted by an interrupter circuit into a square wave voltage, the amplitude of which is equal to the input voltage. The resulting voltage is amplified in the manner of an alternating voltage. In alternating voltage amplifiers, shifts of the operating points remain without influence over a wide range, even if the amplification is increased to the limits of noise. The amplified square wave voltage is rectified and is supplied to a display instrument. This method is described in "Elektronik ohne Ballast" by Otto Limann (4th edition, page 139), Franzis-Verlag Munich, for example.

When magnetic fields are measured by means of magnetic field sensors using the DC method, the measuring precision is affected considerably by noise and offset of the sensors. Especially the lower measuring limit is increased by the 1/f noise and the measuring sensitivity is thus reduced accordingly.

OBJECTS AND SUMMARY OF THE INVENTION

It is the object of the instant invention to create a device to measure a magnetic field in which the influences of noise and offset of the magnetic field sensor are eliminated to a great extent, and which operates with very little power consumption.

In an illustrative embodiment, the invention comprises a Hall element magnetic field sensor (MFS) surrounded by a magnetic shield made of a high permeability magnetic material. The shield is equipped with an excitation coil which can drive the shield to magnetic saturation. The orientation of the shield is such that it effectively shields the Hall MFS from the magnetic field to be measured when the excitation coil is off, but it loses its shielding effectiveness when the excitation coil is energized. If the excitation coil is fed by a square-wave, the Hall MFS will be subjected to the magnetic field to be measured only in the intervals when the excitation coil is energized.

In this way the benefits of noise reduction and elimination of offset voltages are achieved without use of a chopper in the Hall MFS input circuits. Moreover, use of a high permeability magnetic material in the shield reduces the power requirements in the excitation coil.

Specific embodiments of the invention are described below with the aid of the drawings.

DESCRIPTION OF THE DRAWINGS

Identical reference numbers designate identical parts, or parts of the same type, in all the figures.

DETAILED DESCRIPTION OF PREFERRED EMBODIMENTS

Figure 1:
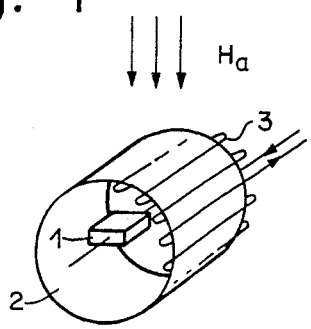
FIG. 1 shows a magnetic field sensor with a cylindrical shield and an excitation coil.

In FIG. 1 a device with a magnetic field sensor 1, shield 2 and an excitation coil 3 is shown. The shield 2 comprises a cylindrical hollow body which surrounds the magnetic field sensor 1. The magnetic field sensor 1 is located at the center of the shield 2. The excitation coil 3 is toroidal in form and is wound evenly around the full circumference of the shield 2. The shield 2 comprises a strongly magnetic material, e.g., mu-metal, and is formed into a cylinder without magnetic discontinuity. The length of the cylinder is calculated so that the magnetic field sensor 1 is shielded completely from a magnetic field $H_a$ perpendicular to the cylinder.

Figure 2:
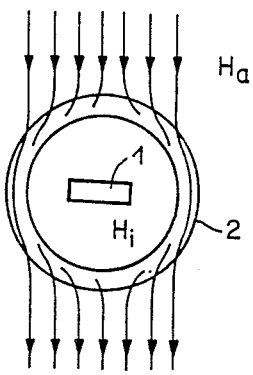
FIG. 2 shows a magnetic field sensor with a non-saturated shield.

FIG. 2 shows how the magnetic field $H_a$ is diverted by the shield 2 around the magnetic field sensor 1. The magnetic field $H_i$ on the inside of the shield 2 is equal to zero.

Figure 3:
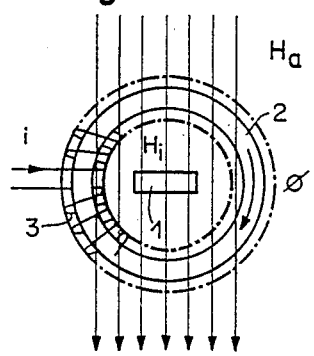
FIG. 3 shows a magnetic field sensor with a saturated shield.

In FIG. 3 the excitation coil 3 which is wound around the full circumference of the shield 2 is excited by a current i. The current i drives the flux $\phi$ through the shield 2. Since the shield 2 is highly permeable and is made without any magnetic discontinuity, even a very low current i is sufficient to drive the shield 2 completely into saturation. The saturated shield 2 is now no longer able to take over a share of flux from the magnetic field $H_a$. The magnetic field $H_a$ is no longer disturbed by the shield 2 and behaves as if no shield 2 were present. The magnetic field $H_i$ is thus equal to the magnetic field $H_a$ with respect to magnitude and direction. The magnetic field sensor 1 is thereby subjected to the full field force of the magnetic field $H_a$. Thus, the shield 2 and the magnetic field $H_i$ within the shield 2 are controlled by the current i. Leakage fields originating at the excitation coil 3 compensate each other mutually at the center of shield 2 and do not influence the magnetic field sensor 1.

The controllable magnetic shield 2 thus shields the magnetic field sensor 1 periodically from the magnetic field $H_a$ to be measured. The output signal of the magnetic field sensor 1 is rectangular, of the same frequency as the exciter current i and proportional in amplitude to the magnetic field $H_a$. By chopping the magnetic field $H_a$ the measurement is transferred to a frequency range in which noise is only of thermal nature. The prevailing 1/f noise at low frequencies is eliminated and thus the lower measuring limits are expanded. At the same time the offset of the magnetic field sensor 1 is also eliminated.

Figure 4:
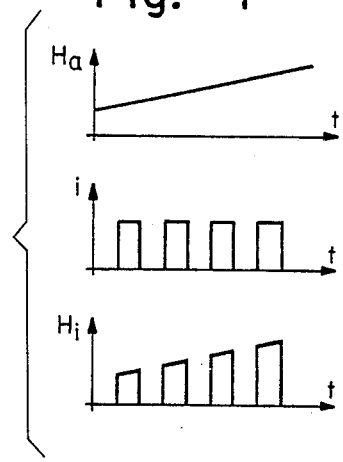
FIG. 4 shows a diagram of the excitation current and of the magnetic field.

In FIG. 4 the situation is shown graphically. When the current i is equal to zero the magnetic field $H_i$ is also zero within the shield 2. If the current i activates the shield 2, the magnetic field $H_i$ attains the full value of the magnetic field $H_a$. The residual magnetism of the material used for the shield 2 has no influence on this process. Wave forms of the current i other than the rectangular form shown in the drawing are also possible. The impulse frequency of the current i can vary widely, depending on the application. With a uniform magnetic field $H_a$ the impulse frequency can be a few Hz; however, with a varying magnetic field $H_a$ the impulse frequency is preferably a multiple of the frequency of the magnetic field $H_a$. The upper limit frequency is determined by skin effect, eddy current losses and spin relaxation effect of the magnetic material.

FIGS. 5 to 8 show further advantageous embodiments of the measuring arrangement.

Figure 5:
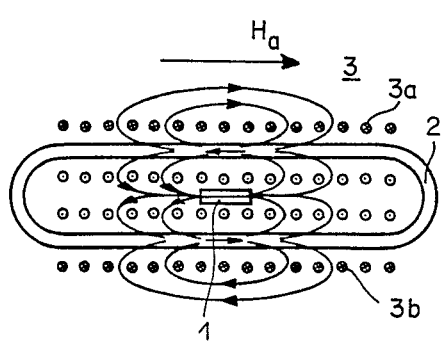
FIG. 5 shows a magnetic field sensor with a closed, flat shield.

In FIG. 5 the shield 2 is of a flat, closed form. The two flat sides of the shield 2 and the flat side of the magnetic field sensor 1 are parallel to the magnetic field $H_a$. The leakage fields extending from the upper half 3a and from the lower half 3b of the excitation coil compensate each other mutually at the magnetic field sensor 1 which is sensitive to magnetic fields oriented in the longitudinal direction. The shielding effect in the direction of the magnetic field $H_a$ is greater than with a cylindrical design. This arrangement furthermore offers advantages when space is restricted.

Figure 6:
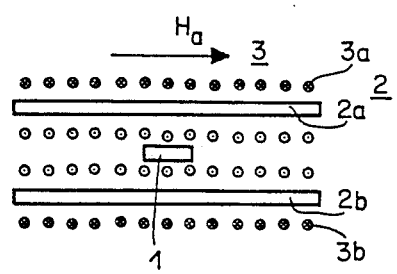
FIG. 6 shows a magnetic field sensor with an open, flat shield.

FIG. 6 shows another embodiment of the measuring arrangement. Two layers 2a, 2b made of magnetic material which are thin in comparison to their length are placed parallel to the magnetic field $H_a$ and as close as possible to each other and constitute the magnetic shield 2. The magnetic field sensor 1, which is sensitive to magnetic fields oriented in the longitudinal direction, is inserted in the magnetic discontinuity between the two thin layers 2a, 2b. The two thin layers 2a, 2b divert the magnetic field $Ha$ around the magnetic field sensor 1 when the coil 3 (comprising portions 3a, 3b) is not excited. Since the layers 2a and 2b are very thin in comparison to their length, they have only a low demagnetizing factor. This makes it possible to produce an open shielding without a significant increase of the excitation current.

Figure 7:
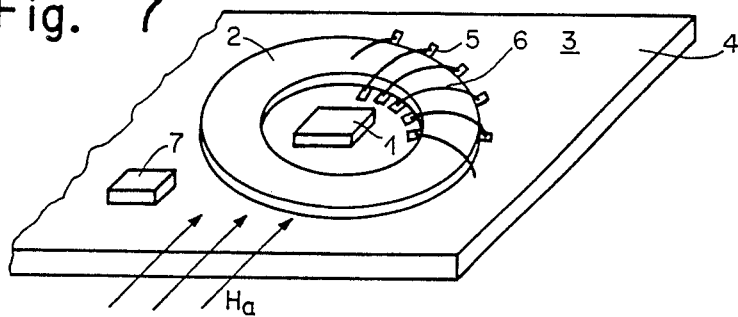
FIG. 7 shows a magnetic field sensor with a shield formed using hybrid technology.

FIG. 7 shows an embodiment of the measuring arrangement in hybrid technology. Short strip conductors in the form of crossties 5 are applied on a ceramic substrate 4. The crossties 5 are arranged radially into a circular ring. A ring-shaped shield 2 made of a magnetic material, e.g., an amorphous metal (metal glass) is glued on the crossties 5. The crossties 5 and the ring-shaped shield 2 are separated by an insulation layer (not shown). Bonded wires 6 connect each inner end of a crosstie 5 with the outer end of a following crosstie 5 and at the same time enclose the shield 2. The totality of the crossties 5 and of the wires 6 together constitute the toroid-shaped excitation coil 3. The magnetic field sensor 1 is attached on the ceramic substrate 4, at the center of the ring-shaped shield 2. The magnetic field sensor 1 measures magnetic fields $H_a$ extending parallel to the ceramic substrate 4. Additional electronic components 7 can be installed outside the ring-shaped shield 2 on the ceramic substrate 4. The electric connections between the magnetic field sensor 1 and the components 7 are achieved by strip conductors on the ceramic substrate 4 or by bonded wire connections.

Figure 8:
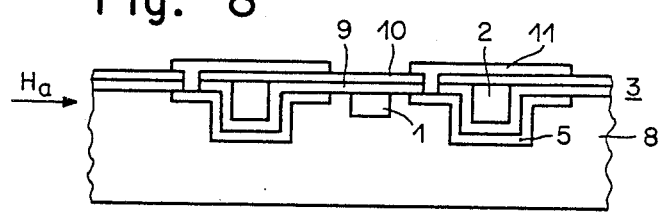
FIG. 8 shows a magnetic field sensor with a shield formed using integrated planar technology.

FIG. 8 shows an embodiment of the measuring arrangement in planar technology. A circular trough is etched into a silicon substrate 8 of conductivity type P. Perpendicularly to the trough, crossties 5 of conductivity type N+ are diffused in. On the inside of the trough a shield 2 made of magnetically conductive material is installed by galvanic methods. The shield 2 is electrically insulated on all sides by means of insulation layers 9 and 10 made of $SiO_2$ which are applied before and after the galvanic treatment. Breaks for connection contacts are provided in the insulation layers 9 and 10 over the inner and outer ends of the crossties 5. The inside end of each crosstie 5 is connected to the outer end of the next crosstie 5 by means of bridges 11 made of vacuum-metallized aluminum. The crossties 5 and the bridges 11 constitute together the excitation coil 3. At the center of the circular ring-shaped shield 2 the magnetic field sensor 1 is integrated into the silicon substrate 8. The magnetic field sensor measures magnetic fields $H_a$ which run parallel to the silicon substrate 8. Additional electronic elements can be provided outside the circular shield 2 and can be connected to the magnetic field sensor or the excitation coil 3.

Figure 9:
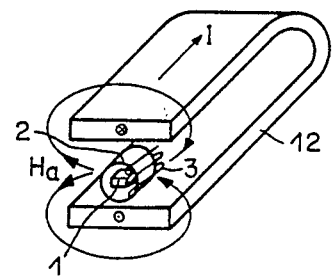
FIG. 9 shows a magnetic field sensor with a shield installed in a current loop.

In FIG. 9 the magnetic field sensor 1, the shield 2 and the excitation coil 3 are arranged in such manner in a current loop 12 that the magnetic field Ha generated by the current loop 12 is detected by the magnetic field sensor 1. Current loops of this type are used in static electricity meters for example. With a Hall element being used as the magnetic field sensor 1, it is possible to measure the electric power in a known manner from the load connected to the electricity meter. By using the hybrid technology shown in FIG. 7 or the planar technology shown in FIG. 8 the construction of the measuring mechanism of electricity meters can be simplified considerably.

Figure 10:
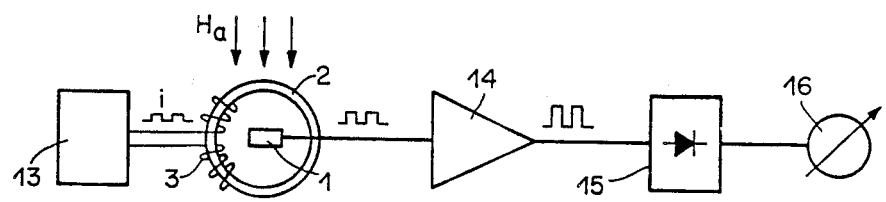
FIG. 10 shows a block diagram of a complete measuring arrangement.

FIG. 10 shows a complete measuring arrangement with the magnetic field sensor 1, the shield 2, the excitation coil 3, an impulse generator 13, an amplifier 14, a rectifier 15 and a measuring instrument 16. The output of the impulse generator 13 is connected to the excitation coil 3. The current impulses i supplied by the impulse generator 13 drive the shield 2 intermittently into saturation. The magnetic field $H_a$ is thereby chopped up. The impulses obtained at the output of the magnetic field sensor 1 are then processed in the form of an AC signal. These are fed to the amplifier 14 in which they are proportionally amplified. The output of the amplifier 14 is connected to the rectifier 15 which rectifies the amplified AC signal and feeds it to the measuring instrument 16.

The described principle for the chopping of the magnetic field magnetic field $H_a$ to be measured is suitable for different magnetic field sensors, e.g. for magneto-diodes, magneto-transistors or Hall elements. The fact that the measured value of magnetic field $H_a$ and not only the output signal of the magnetic field sensor 1 is chopped up is to be seen as an advantage. In this manner the 1/f noise and the offset of the magnetic field sensor 1 and of the downstream amplification elements are eliminated. Furthermore, very little energy is required to chop the magnetic field $H_a$. The low requirement in energy is of great significance when recording or measuring instruments, e.g. electricity meters, are used. When several magnetic field sensors 1 are used it is possible to measure not only the intensity but also the direction of a magnetic field $H_a$. Thus, by means of a cross-wise arrangement of two Hall elements within the shield 2 it is possible to create an electronic compass.

The above-described embodiments of the invention are intended to be illustrative only. Numerous alternative embodiments may be devised by those skilled in the art without departing from the spirit and scope of the following claims.

We claim:

1. A combination comprising
a Hall element for producing an output signal which serves as a measurement of a magnetic field, and
means for reducing the effects of noise and offset voltage on the output signal of said Hall element comprising a controllable magnetic shield enclosing said Hall element for intermittently shielding the Hall element from the magnetic field to be measured and activating means coupled to the controlled magnetic shield for intermittently activating said shield at a predetermined frequency.

2. A combination comprising
a magneto-diode for producing an output signal which serves as a measurement of a magnetic field, and
means for reducing the effects of noise and offset voltage on the output signal of said magneto-diode comprising a controllable magnetic shield enclosing said magneto-diode for intermittently shielding the magneto-diode from the magnetic field to be measured and activating means coupled to the controllable magnetic shield for intermittently activating said shield at a predetermined frequency.

3. A combination comprising
a magneto-transistor for producing an output signal which serves as a measurement of a magnetic field, and
means for reducing the effects of noise and offset voltage on the output signal of said magneto-transistor comprising a controllable magnetic shield enclosing the magneto-transistor for intermittently shielding the magnetic magneto-transistor from the magnetic field to be measured and activating means coupled to the controllable magnetic shield for intermittently activating said shield at a predetermined frequency.

4. A combination of claims 1, 2 or 3 wherein said activating means is an excitation coil wound about said controllable magnetic shield.

5. The combination of claims 1, 2, or 3 wherein said magnetic shield is formed from a magnetic material and said coil serves to intermittently bring said shield into saturation.

6. The combination of claims 1, 2, or 3 wherein said controllable magnetic shield comprises an amorphous metal.

7. The combination of claims 1, 2, or 3 wherein said controllable magnetic shield comprises a cylindrical hollow body.

8. The combination of claims 1, 2, or 3 wherein said controllable magnetic shield comprises two spaced apart parallel layers of magnetic material.

9. The combination of claim 1 wherein said controllable magnetic shield is ring-shaped, wherein said activating means comprises an excitation coil in the form of a toroid, wherein said controllable magnetic shield, said excitation coil and said Hall element are arranged on a common substrate, and wherein said excitation coil comprises cross-ties which are radially arranged on said substrate under said ringshaped magnetic shield and which are connected to conductors passing over said ring-shaped magnetic shield.

10. The combination of claim 9 wherein said conductors are in the form of vacuum metalized bridges.

11. The combination of claim 2 wherein said controllable magnetic shield is ring-shaped, wherein said activating means comprises an excitation coil in the form of a toroid, wherein said controllable magnetic shield, said excitation coil, and said magneto-diode are arranged on a common substrate, and wherein said excitation coil comprises cross-ties which are radially arranged on said substrate under said ring-shaped magnetic shield and which are connected to conductors passing over said ring-shaped magnetic shield.

12. The combination of claim 11 wherein said conductors are in the form of vacuum metalized bridges.

13. The combination of claim 3 wherein said controllable magnetic shield is ring-shaped, wherein said activating means comprises an excitation coil in the form of a toroid, wherein said controllable magnetic shield, said excitation coil, and said magneto-transistor are arranged on a common substrate, and wherein said excitation coil comprises cross-ties which are radially arranged on said substrate under said ring-shaped magnetic shield and which are connected to conductors passing over said ring-shaped magnetic shield.

14. The combination of claim 13 wherein said conductors are in the form of vacuum metalized bridges.

* * * * *